(12) United States Patent
Abe

(10) Patent No.: US 7,875,982 B2
(45) Date of Patent: Jan. 25, 2011

(54) SEMICONDUCTOR DEVICE FOR PREVENTING VOIDS IN THE CONTACT REGION AND METHOD OF FORMING THE SAME

(75) Inventor: Satoshi Abe, Hyogo (JP)

(73) Assignees: Renesas Electronics Corporation, Tokyo (JP); Powerchip Semiconductor Corp., Hsinchu (TW)

( * ) Notice: Subject to any disclaimer, the term of this patent is extended or adjusted under 35 U.S.C. 154(b) by 362 days.

(21) Appl. No.: 12/188,881

(22) Filed: Aug. 8, 2008

(65) Prior Publication Data

US 2009/0045521 A1  Feb. 19, 2009

(30) Foreign Application Priority Data

Aug. 13, 2007 (JP) ............................. 2007-210822

(51) Int. Cl.
H01L 23/48 (2006.01)
H01L 23/52 (2006.01)
H01L 29/40 (2006.01)

(52) U.S. Cl. ....................... 257/774; 257/775
(58) Field of Classification Search .......... 257/E21.577, 257/E21.575, 774, 775
See application file for complete search history.

(56) References Cited

U.S. PATENT DOCUMENTS

2003/0132525 A1* 7/2003 Yoshihara et al. ........... 257/773

2005/0185486 A9* 8/2005 Lee et al. .................... 365/202

FOREIGN PATENT DOCUMENTS

JP  11-307531  11/1999

* cited by examiner

Primary Examiner—Thao X Le
Assistant Examiner—Thanh Y Tran
(74) Attorney, Agent, or Firm—McDermott Will & Emery LLP

(57) ABSTRACT

A semiconductor device includes: an interlayer insulation film; a lower interconnection layer; an upper interconnection layer; and a via hole extending through the interlayer insulation film to establish electric connection between the lower and upper interconnections; wherein a plurality of interconnection lines is provided in the lower interconnection layer, and a contact region is formed for contact with the via hole by partially joining at least two interconnection lines, and a void exists in a first region of the interlayer insulation film located between adjacent interconnection lines, and no void exists in a second region of the interlayer insulation film located between a contacting portion of the via hole in the contact region and an interconnection line adjacent to the contact region, whereby reliably preventing any contact between a via hole and a void formed in an interlayer insulation film even when the via hole is greatly displaced.

7 Claims, 5 Drawing Sheets

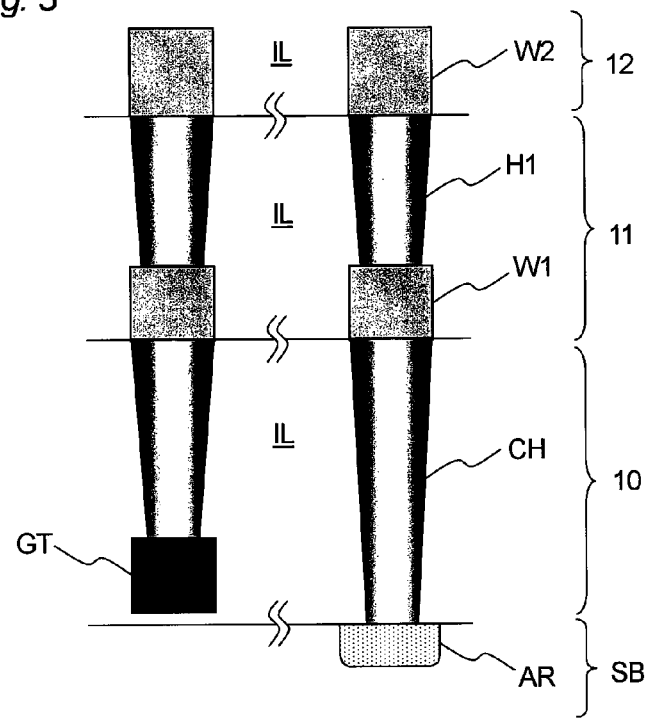
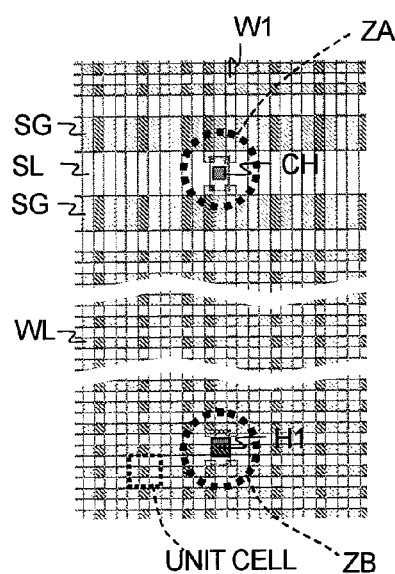 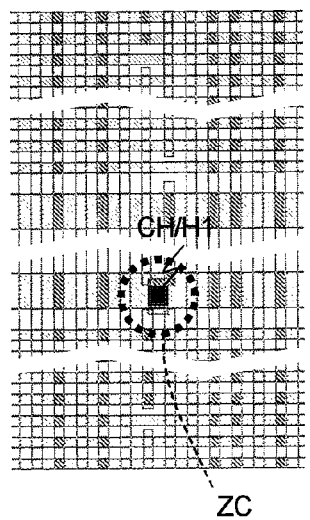 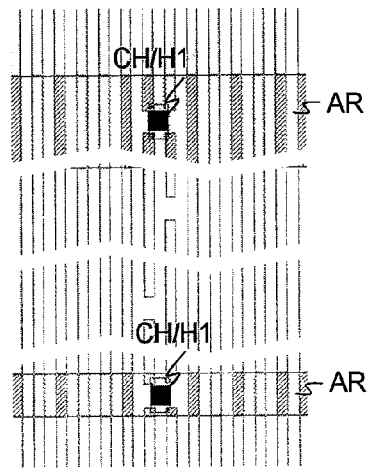

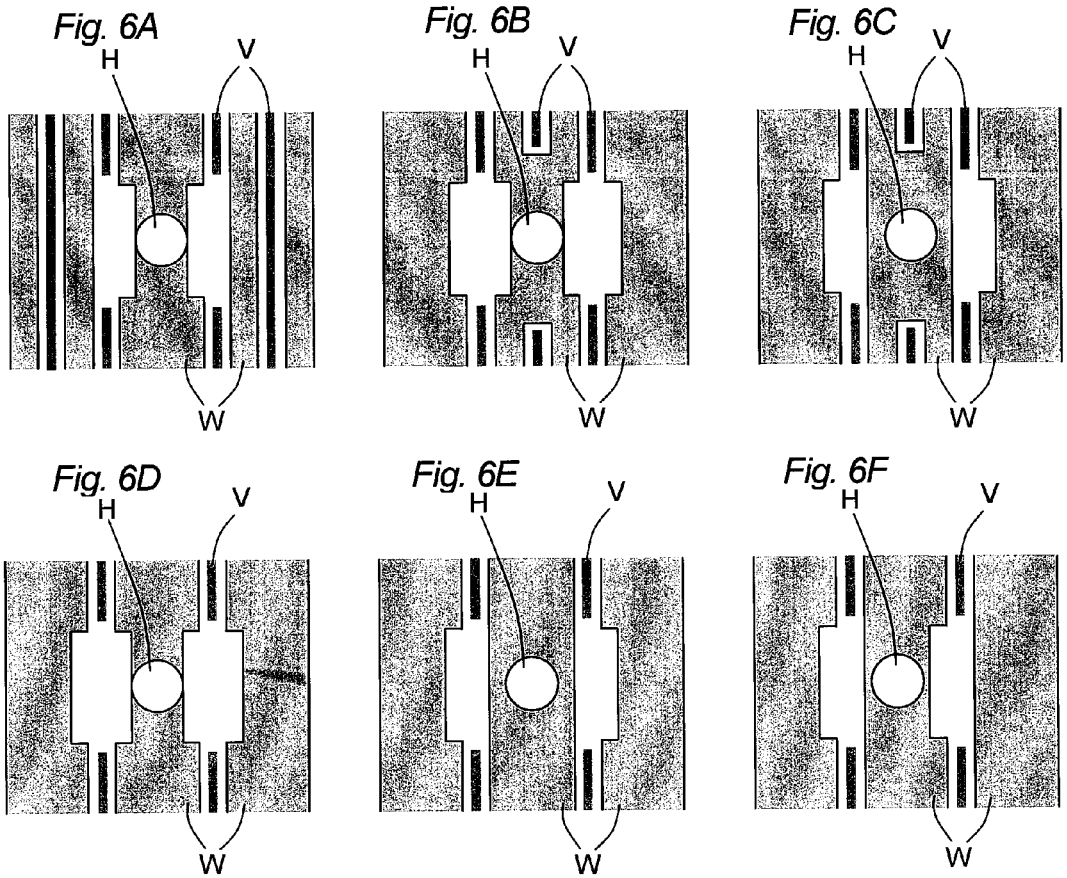
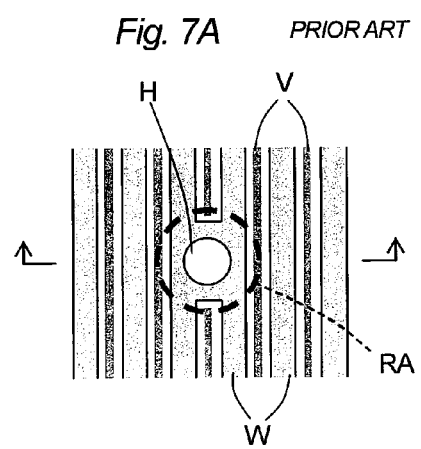
Fig. 7A  PRIOR ART
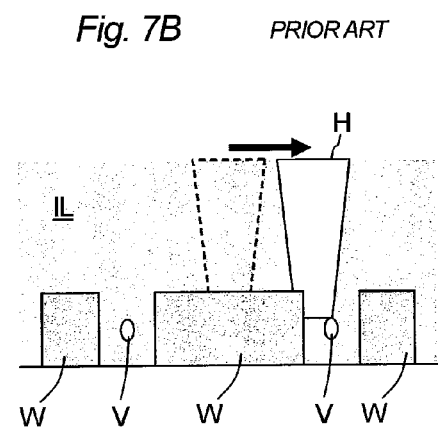
Fig. 7B  PRIOR ART

SEMICONDUCTOR DEVICE FOR PREVENTING VOIDS IN THE CONTACT REGION AND METHOD OF FORMING THE SAME

BACKGROUND OF THE INVENTION

1. Field of the Invention

The present invention relates to a semiconductor device, for example, a semiconductor integrated circuit including highly-dense interconnection patterns, such as DRAM (Dynamic Random Access Memory), SRAM (Static Random Access Memory), ROM (Read Only Memory), flash memory and SoC (System-on-Chip).

2. Description of the Related Art

Prior art (JP-11-307531A (1999)) refers to voids generated in interlayer insulation films as interconnections is further minimized. More specifically, narrower interconnections other than those of via contact sections are formed so as to suppress generation of voids, and also the volume of the voids in an entire IC is reduced so as to prevent burst failure of IC which may be caused by void swelling during heat treatment in manufacturing IC.

However, in the prior art, a void exists on the lateral side of the via contact section, and therefore when a via hole is displaced, it may easily come into contact with the void. This inevitably causes such problems as invasion of metal materials and intrusion of polymer cleaning liquid into the aforementioned void.

In recent years, highly-dense interconnections are being developed in such fields as semiconductor memories, and the mass production of flash memories with an interconnection pitch of 70 nm has just started in 2007. In the future, highly-dense interconnections with a pitch narrower than 70 nm will be demanded.

FIG. 7A is a plan view showing an example of layout of an interconnection pattern in a flash memory, which was previously studied by the present inventor, and FIG. 7B is a central cross sectional view of FIG. 7A. Generally, flash memories have a plurality of interconnection layers, with the interconnection layer nearest to a semiconductor substrate having the highest interconnection density.

FIG. 7A illustrates a part of an interconnection pattern of the lowermost layer, in which the interconnection pattern is designed with a pitch of 140 nm including interconnections W with a width of 70 nm and inter-interconnection spaces with a width of 70 nm (i.e., L(line)/S(Space)=70/70 nm).

As shown in FIG. 7B, an interlayer insulation film IL is embedded in between interconnection layers, and a via hole H is formed to establish vertical electric connection between the interconnection layers. The via hole H generally has a tapered shape with an upper diameter larger than a lower (substrate-side) diameter, which is attributed to manufacturing process. In the case of designing the interconnections with a pitch of 140 nm, the smallest via hole H is so formed that a lower diameter has a standard value of, for example, 130 nm (minimum value of 110 nm and maximum value of 150 nm) and an upper diameter has a standard value of 180 nm.

Therefore, as shown in FIG. 7A, two adjacent interconnection lines are partially joined to obtain a contact region in a generally square shape of 210 nm in width×210 nm in length, and the via holes H as described above is placed so as to be aligned with the center of the contact region.

When interconnections of a narrow pitch (e.g., inter-interconnection space is 80 nm or less) are embedded in the insulation film layer, a minute void (cavity) V may be generated between interconnection lines as shown in FIG. 7B. Such voids appear in various places of the narrow pitch space between interconnection lines as shown in FIG. 7A.

Meanwhile, the via hole H is sometimes displaced from the center of the contact region due to, e.g., mask alignment error during lithography process. Assuming that the displacement of the via hole H is isotropic with respect to the center of the contact region, a maximum shift range RA of the via hole H can be expressed as a circumscribed circle of the displaced via holes H as shown in FIG. 7A.

If the via hole H is greatly displaced to come into contact with the void V in between interconnection lines as shown in FIG. 7B, metal materials of the via hole (such as Ti, TiN, W, etc. in case of W (tungsten) plug) may invade into the void V, which may lead to deterioration of reliability, such as interline TDDB (Time Dependence on Dielectric Breakdown).

Moreover, during polymer washing process after etching of the hole, chemical may enter into the void, and as a consequence, when a metal material is deposited on the inner surface of the hole to create the via hole H, deposition of the metal material may be failed due to generation of gas (degas) from the chemical.

In order to control voids causing such failure, it is generally necessary to either increase the interconnection pitch so as to expand the space width between interconnections or decrease the thickness of the metal layer so as to reduce the interconnection height. However, the former solution leads to expansion of a chip area and decrease in interconnection density, whereas the latter solution causes increase in interconnection resistance.

SUMMARY OF THE INVENTION

An object of the present invention is to provide a semiconductor device which can reliably prevent any contact between a via hole and a void formed in an interlayer insulation film even when the via hole is greatly displaced, thereby achieving higher reliability and higher yield.

According to an embodiment of the invention, even when a void is generated in an interlayer insulation film located in between interconnection lines adjacent to each other as density of interconnections is further increased, a contact region can be formed by partial joining of at least two interconnection lines and can be provided with a local notch shape so as to keep a space width without generation of any voids.

According to another embodiment of the invention, S1<S2 is satisfied, wherein S1 is a space width between interconnection lines adjacent to each other, and S2 is a space width between a contact region and an interconnection line adjacent to the contact region, as measured along a straight line passing through a contacting portion of a via hole in the contact region and extending in a second direction perpendicular to a first direction.

It is also preferable to satisfy S1<Lc, wherein Lc is a width of a contact region, as measured along the straight line passing through the contacting portion of the via hole in the contact region and extending in the second direction.

It is also preferable to satisfy S1<S2<Lc.

It is also preferable to satisfy S1<80 nm (nanometer) and S2>80 nm.

According to the embodiment, any void does not exist in the interlayer insulation film located between the contacting portion of the via hole and the interconnection line adjacent thereto, thereby reliably preventing any contact between the via hole and the void in a case the via hole is greatly displaced or formed larger due to manufacturing errors. Consequently, higher reliability and higher yield of the semiconductor device can be achieved.

BRIEF DESCRIPTION OF THE DRAWINGS

FIG. 3 is a partial sectional view showing interconnection layers each involving stacked via holes;

FIG. 4A is a partial plan view showing a part of a cell section of a flash memory, FIG. 4B is a partial plan view showing another part of the cell section of the flash memory, and FIG. 4C is a partial plan view showing a part of a page buffer section of the flash memory;

FIGS. 6A to 6F are plan views showing various examples of layouts of interconnection patterns in the contact region and adjacent regions thereof according to the invention; and FIG. 7A is a plan view showing an example of layout of an interconnection pattern in a conventional flash memory, and FIG. 7B is a central cross sectional view of FIG. 7A.

DETAILED DESCRIPTION OF THE PREFERRED EMBODIMENTS

This application is based on the application No. 2007-210822 filed on Aug. 13, 2007 in Japan, the disclosure of which is incorporated herein by reference.

Hereinafter, preferred embodiments will be described with reference to drawings.

Embodiment 1

Figure 1A:
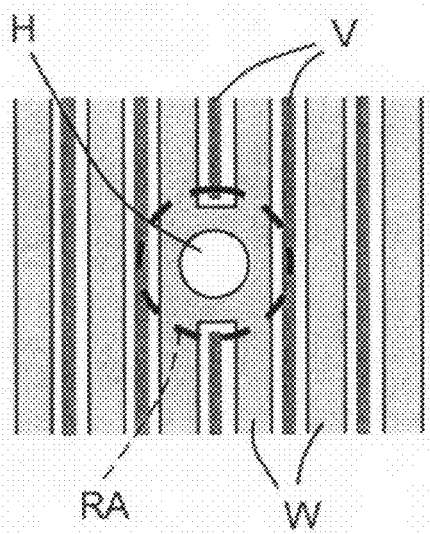
FIG. 1A is a plan view showing an example of layout of a conventional interconnection pattern as a comparative example.
Figure 1B:
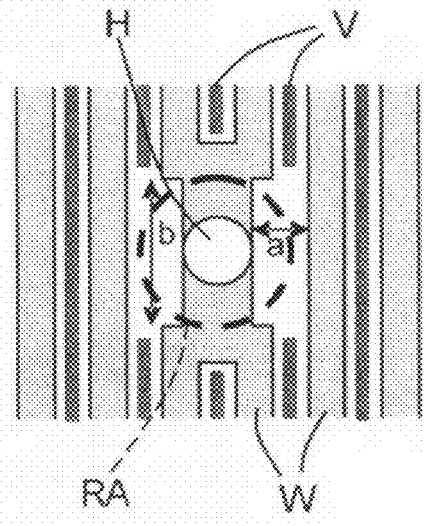
FIG. 1B is a plan view showing an example of layout of an interconnection pattern according to an embodiment of the invention.
Figure 1C:
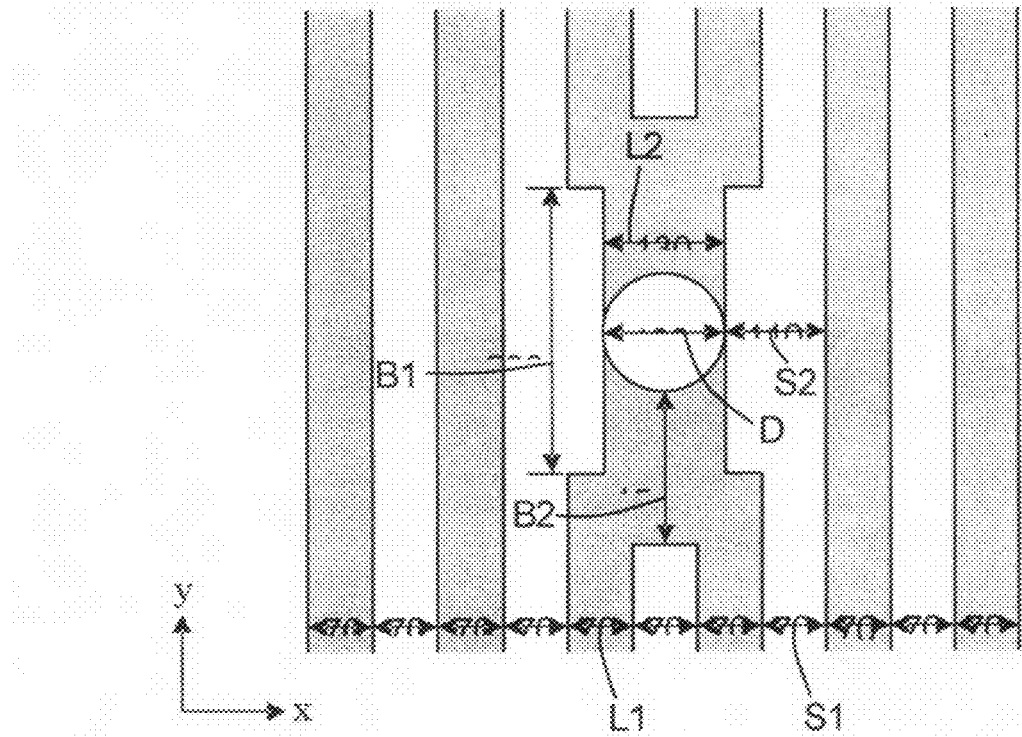
FIG. 1C is an enlarged view of FIG. 1B.

FIG. 1A is a plan view showing an example of layout of a conventional interconnection pattern as a comparative example. FIG. 1B is a plan view showing an example of layout of an interconnection pattern according to an embodiment of the invention, and FIG. 1C is an enlarged view of FIG. 1B.

Hereinafter, layout of the interconnection pattern in a flash memory will be explained by way of example, the invention can be applied to various kinds of semiconductor integrated circuits, such as DRAM, SRAM, ROM and SoC.

Since semiconductor integrated circuits generally have a plurality of interconnection layers, with the lowermost interconnection layer nearest to a semiconductor substrate having the highest interconnection density, the most critical dimensional and positional accuracy are required for the lowermost interconnection layer. An interlayer insulation film is embedded in between the lower interconnection layer and the upper interconnection layer, and a via hole H is formed so as to extend through the interlayer insulation film in order to establish vertical electric connection between the interconnection layers.

The interlayer insulation film is formed from USG (Undoped Silicate Glass) films, FSG (Fluoride Silicate Glass) films or TEOS (TetraEthyl OrthoSilicate) films, using HDP (High Density Plasma)-CVD (Chemical Vapor Deposition), plasma CVD, heat CVD and the like.

FIGS. 1A to 1C illustrate a part of the interconnection pattern of the lowermost layer by way of example, in which the interconnection pattern is designed with a pitch of 140 nm including interconnections W with a width of 70 nm and inter-interconnection spaces with a width of 70 nm (i.e., L(line)/S(Space)=70/70 nm), with a plurality of interconnection lines W extending along a predetermined direction (y direction in the drawing).

In the case of designing the interconnections with a pitch of 140 nm, the smallest via hole H is so formed that a diameter of the portion in contact with the lowest layer has a standard value of, for example, 130 nm (minimum value of 110 nm and maximum value of 150 nm).

Therefore, two adjacent interconnection lines are partially joined to each other to obtain a contact region in a generally square shape of 210 nm in width×210 nm in length, and the via holes H as described above is placed so as to be aligned with the center of the contact region.

Moreover, since the width of a space located in between the interconnection lines W adjacent to each other is 70 nm, when an interlayer insulation film is embedded therein, minute voids (cavities) V appear in various places in the narrow pitch space as shown in FIG. 1A. Many experimental results reveal that such voids V are likely to be created as the space width is 80 nm or less.

In the present embodiment, even when the space width is 80 nm or less, as shown in FIG. 1B, a local notch shape can be given to the contact region which is formed by partial joining of at least two interconnection lines so as to keep a space width without generation of any voids V. In other words, any void V does not exist in the interlayer insulation film located in between the contacting portion of the via hole H in the contact region and the interconnection line W adjacent to the contact region.

Therefore, even in a case the via hole is greatly displaced or formed larger within the maximum shift range RA due to manufacturing errors, any contact between the via hole H and the void V can be reliably prevented. Consequently, higher reliability and higher yield of the semiconductor device can be achieved.

The dimensions of the notch can be determined by the following procedures: (1) Check by an experiment a minimum space width (70 nm in this case) which allows the interlayer insulation film to be embedded in the lowermost interconnection layer; (2) Determine a space width (size (a) shown in FIG. 1B) which does not generate any void in consideration of size variation of the space width; (3) Determine a length (size (b) shown in FIG. 1B) of the notch in consideration of both displacement of the via hole H and size variation (in particular, larger finished size) of the via hole H, which can be expressed as the maximum shift range RA.

FIG. 1C show an example of the dimensions of the notch determined according to the above procedures (1) to (3). Here, S1 is defined as the space width between interconnection lines adjacent to each other, and S2 is defined as the space width between the contact region and the interconnection line adjacent thereto, as measured along a straight line passing through the contacting portion of the via hole in the contact region and extending in x direction in the drawing.

Moreover, L1 is defined as the width of the interconnection line W, L2 is defined as the width of the notched contact region, and D is defined as the diameter of the contacting portion of the via hole H in the contact region. Furthermore, B1 is defined as the length of the notch in the contact region, and B2 is defined as the length from a y-direction edge in the contact region to the contacting portion of the via hole H.

In the example shown in FIG. 1C, standard values of respective dimensions are designed as S1=70 nm, S2=110 nm, L1=70 nm, L2=130 nm, D=130 nm, B1=290 nm, and B2=150 nm. It is to be noted that the thickness of the interconnection line W is 90 nm.

In the invention, designing the interconnection pattern so as to satisfy S1<S2 can prevent any void from appearing in the interlayer insulation film which is located between the contacting portion of the via hole and the interconnection line adjacent thereto, thereby reliably preventing any contact between the via hole and the void in a case the via hole is greatly displaced or formed larger due to manufacturing errors.

Moreover, it is preferable to design the interconnection pattern so as to satisfy S1<D, thereby forming the via hole H with relatively large current capacity even in a highly-dense interconnection pattern.

Further, it is preferable to design the interconnection pattern so as to satisfy S1<S2<D, thereby reliably preventing any contact between the via hole H and the void while achieving the via hole H with relatively large current capacity.

Furthermore, it is preferable to design the interconnection pattern so as to satisfy S1<80 nm and S2>80 nm, thereby reliably preventing any contact between the via hole H and the void while achieving a highly-dense interconnection pattern.

In addition, two adjacent interconnection lines are partially joined to form the generally rectangular contact region having width L2=130 nm×length B1=290 nm with notches being located on both side thereof. Thus, partial joining of two adjacent interconnection lines enables L2 to become sufficiently larger than L1, even though the notches are located. Therefore, the via hole can be made in contact with the interconnection line in a case the via hole is greatly displaced due to manufacturing errors.

Figure 2:
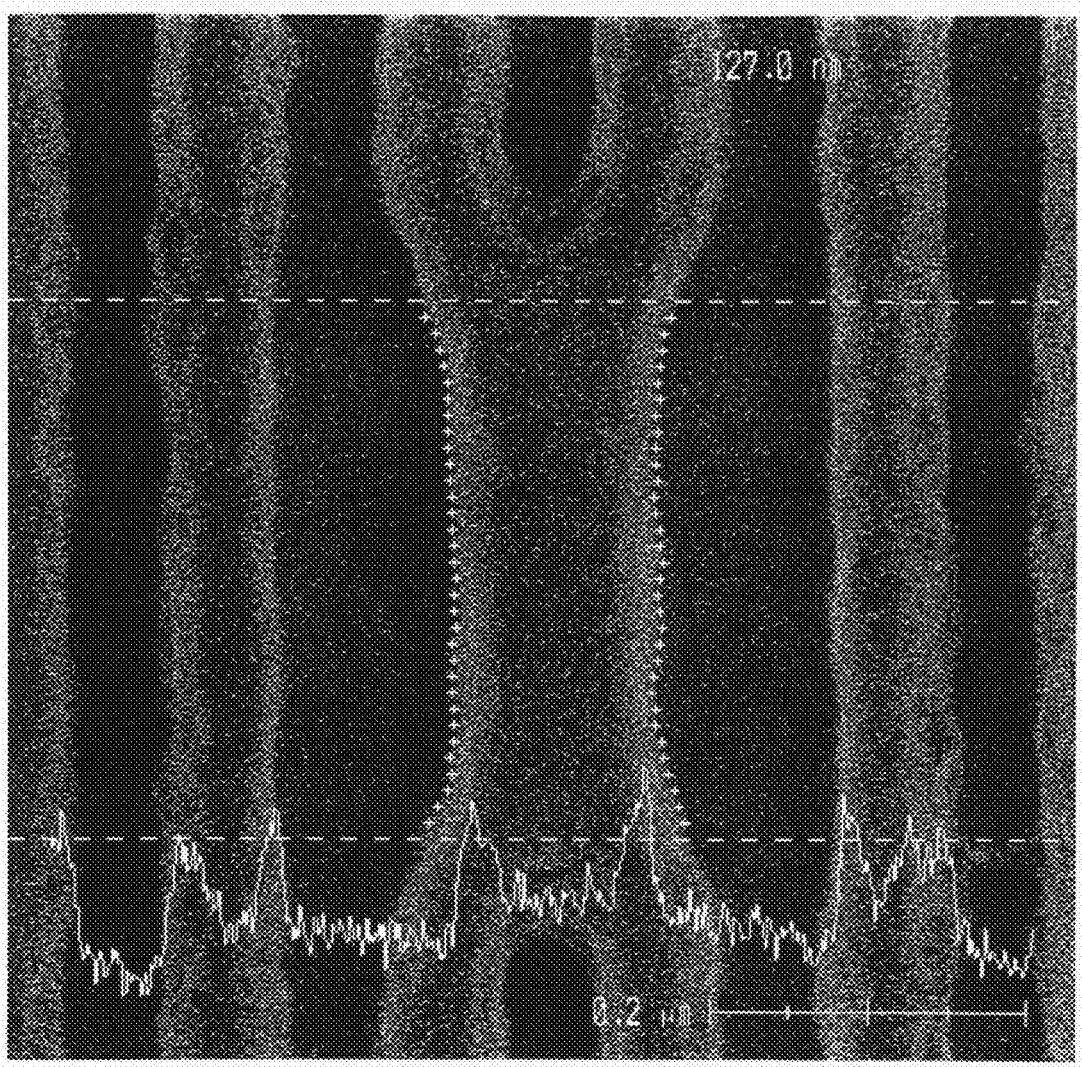
FIG. 2 is a photograph view showing a shape of a resist pattern after photoengraving process.

FIG. 2 is a photograph view showing a shape of a resist pattern after photoengraving process. Etching process is performed in this state so that an area having no resist pattern is removed to form an interline space. Then, the resist pattern is removed so that the interconnection line W and the contact region can be obtained.

Although, for a mask for the interconnection pattern, as shown in FIG. 1C, a pattern is formed by combining x-direction segments and y-direction segments, it is shown that corners of the resist pattern is rounded due to diffraction of exposure light and other causes. In this case, satisfaction of S1<S2 can prevent any void from appearing on the lateral side (S2 area) of the contact region, thereby reliably preventing any contact between the via hole and the void.

Next, an example of a NAND flash memory will be described below, wherein minimum design rule of L/S=70/70 nm is employed in the lowermost interconnection layer nearest to a semiconductor substrate.

Figure 5:
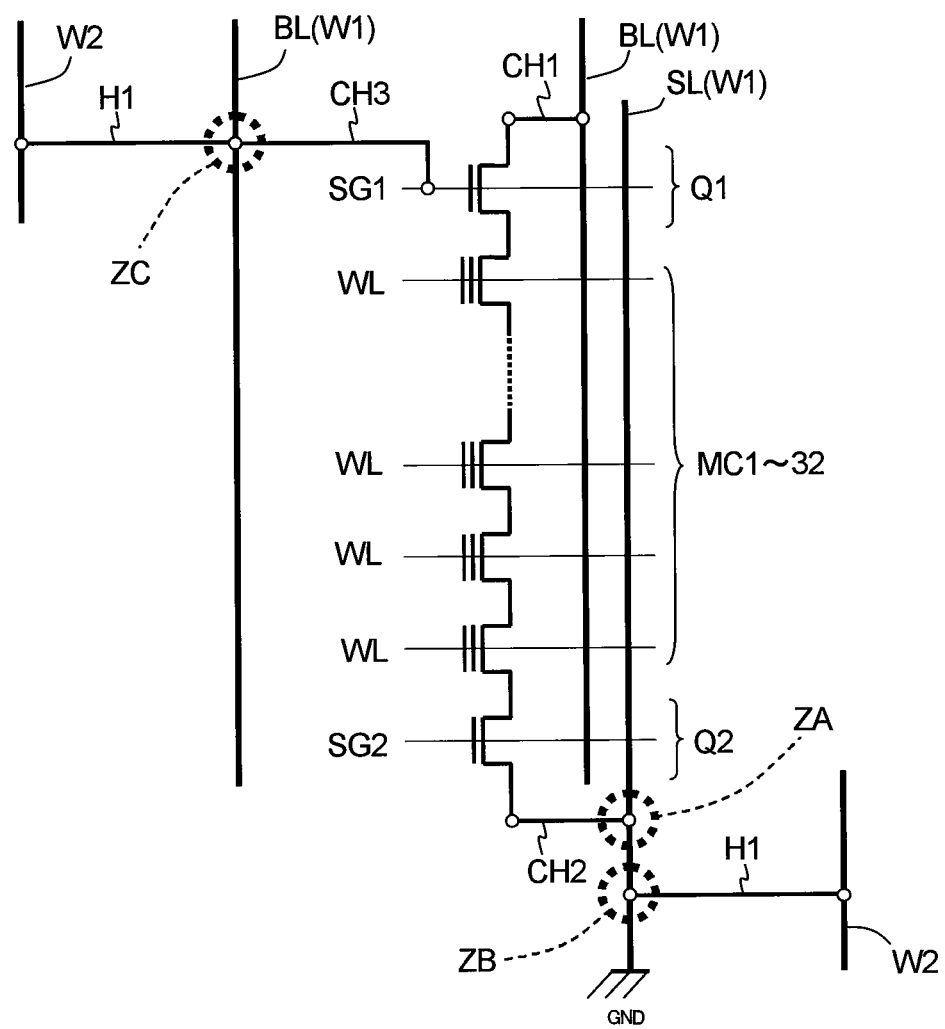
FIG. 5 is a circuit diagram showing an example of a NAND-type flash memory.

FIG. 3 is a partial sectional view showing interconnection layers each involving stacked via holes. FIG. 4A is a partial plan view showing a part of a cell section of a flash memory. FIG. 4B is a partial plan view showing another part of the cell section of the flash memory. FIG. 4C is a partial plan view showing a part of a page buffer section of the flash memory. FIG. 5 is a circuit diagram showing an example of a NAND-type flash memory.

First, with reference to FIG. 3, devices such as FET are formed on a semiconductor substrate SB, and then contact holes CH are formed in a contact interconnection layer 10 lying on the substrate SB for connection with a gate electrode GT, an active region of FET and the like so as to extend through an interlayer insulation film IL.

A first interconnection layer 11 is a lowermost interconnection layer to which a minimum design rule is applied. The aforementioned interconnection line W1, the contact region, and the inter-interconnection line space are formed in this layer, and via holes H1 are provided so as to extend through the interlayer insulation film IL. In a second interconnection layer 12, to which another design rule of L/S=140/140 nm is applied, interconnection lines W2 which are each connected with the via holes H1 residing in the first interconnection layer 11 and other interconnections are formed.

Here, the interconnection line W1 in the first interconnection layer 11 is formed from tungsten, alternatively, it can be formed using aluminum interconnection materials, such as AlSiCu and AlCu. The interconnection line W2 in the second interconnection layer 12 is formed using aluminum interconnection materials, such as AlCu.

Here, the via hole H1 and the contact hole CH are formed from tungsten, alternatively, they can be formed using aluminum interconnection materials, such as AlSiCu and AlCu. The via hole H1 and the contact hole CH are generally surrounded with a thin barrier metal layer (not shown). The interlayer insulation film IL is formed from USG film, FSG film, or TEOS film using HDP-CVD, plasma CVD, heat CVD and the like.

Next, with reference to FIG. 5, 32 memory cells MC1 to MC32 are connected in series, with selection transistors Q1 and Q2 being placed on both ends thereof, respectively. The memory cell MC1 is connected via the selection transistor Q1 to a bit line BL, which is constituted of an interconnection line W1, by means of an active region contact hole CH1.

The memory cell MC32 is connected via the selection transistor Q2 to a source line connection line SL, which is constituted of an interconnection line W1, by means of a source line contact hole CH2 (connection node ZA). Further, the source line connection line SL is connected through a via hole H1 residing in the first interconnection layer 11 to an interconnection line W2 in the second interconnection layer 12 (connection node ZB).

The selection line SG1 connected to the gate of the selection transistor Q1 is connected through a selection line contact hole CH3 to another bit line BL, which is constituted of an interconnection line W1, and is further connected through the via hole H1 residing in the first interconnection layer 11 to an interconnection line W2 in the second interconnection layer 12 (connection node ZC).

Next, with reference to FIGS. 4A to 4C, the contact region having a notch according to the invention is applied to the connection node of each contact hole CH or each via hole H. In the connection node ZA of FIG. 4A, two adjacent interconnection lines W1 are partially joined to form a contact region, which is connected to the contact hole CH. In the connection node ZB of FIG. 4A, two adjacent interconnection lines W1 are partially joined to form a contact region, which is connected to the via hole H1.

In the connection node ZC of FIG. 4B, two adjacent interconnection lines W1 are partially joined to form a contact region, through which the contact hole CH and the via hole H1 are stacked and connected to each other. Also in FIG. 4C, the contact hole CH and the via hole H1 are stacked and connected to each other through the contact region.

Although the above description exemplifies that two adjacent interconnection lines are partially joined to form a contact region, but three or more adjacent interconnection lines may be partially joined to form a contact region.

When the design rule for highly-dense interconnections is applied in this way, at least two interconnection lines are partially joined to form a contact region, and an interconnection pattern is designed to satisfy S1<S2. This can prevent any void from appearing in an interlayer insulation film located between a contacting portion of a via hole and an interconnection line adjacent thereto. Consequently, any contact between the via hole H and the void can be reliably prevented, even in a case the via hole is greatly displaced or formed largely due to manufacturing errors.

Embodiment 2

FIGS. 6A to 6F are plan views showing various examples of layouts of interconnection patterns in the contact region and adjacent regions thereof according to the invention. First, in FIG. 6A, the shape of the notch in the contact region to which the via hole H is connected is the same as that of FIG. 1B, whereas the joint portion of the two interconnection lines W for forming the contact region is longer than that of FIG. 1B.

In FIG. 6B, the shape of the notch in the contact region to which the via hole H is connected is the same as that of FIG. 1B, whereas two or more interconnection lines W adjacent to the contact region are joined to each other, in which other notches are provided so as to face the notches in the contact region, respectively.

In FIG. 6C, two or more interconnection lines W adjacent to the contact region to which the via hole H is connected are joined to each other, and the contact region is not provided with any notches but the adjacent interconnection lines W are each provided with notches so as to secure interline spaces.

In FIG. 6D, the shape of the notch in the contact region to which the via hole H is connected is the same as that of FIG. 6A, and adjacent interconnection lines W are also provided with notches so as to secure interline spaces.

In FIG. 6E, two or more interconnection lines W adjacent to the contact region to which the via hole H is connected are joined to each other, and the joint portion has a longer length. Further, the contact region is not provided with any notches but the adjacent interconnection lines W are each provided with notches so as to secure interline spaces.

In FIG. 6F, two or more interconnection lines W adjacent to the contact region to which the via hole H is connected are joined to each other, and a notch is provided only on the right-hand side of the contact region, and the adjacent interconnection line W is also provided with a notch facing the left-hand side of the contact region so as to secure interline spaces.

As shown in FIGS. 6A to 6F, a space of sufficient width is secured on the lateral sides of the contact region to which the via hole H is connected, thereby preventing any void V from appearing in the interlayer insulation film. As a result, contact between the via hole H and the void V can certainly be prevented.

The invention is very useful for industrial application, since semiconductor devices including fine and precise interconnection patterns can be manufactured with higher reliability and higher yield.

Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor device comprising:
an interlayer insulation film;
a lower interconnection layer located under the interlayer insulation film;
an upper interconnection layer located above the interlayer insulation film; and
a via hole extending through the interlayer insulation film to establish electric connection between an interconnection line residing in the lower interconnection layer and another interconnection line residing in the upper interconnection layer;
wherein a plurality of interconnection lines extending along a predetermined direction is provided in the lower interconnection layer, and a contact region is formed for contact with the via hole by partially joining at least two interconnection lines, and
a void exists in a first region of the interlayer insulation film located between adjacent interconnection lines out of the plurality of interconnection lines, and
no void exists in a second region of the interlayer insulation film located between a contacting portion of the via hole in the contact region and an interconnection line adjacent to the contact region.

2. A semiconductor device comprising:
an interlayer insulation film;
a lower interconnection layer located under the interlayer insulation film;
an upper interconnection layer located above the interlayer insulation film; and
a via hole extending through the interlayer insulation film to establish electric connection between an interconnection line residing in the lower interconnection layer and another interconnection line residing in the upper interconnection layer;
wherein a plurality of interconnection lines extending along a first direction is provided in the lower interconnection layer, and a contact region is formed for contact with the via hole by partially joining at least two interconnection lines, and the device satisfies the following relation:

$$S1<S2$$

where S1 is defined as a space width between interconnection lines adjacent to each other, and S2 is defined as a space width between the contact region and the interconnection line adjacent thereto, as measured along a straight line passing through the contacting portion of the via hole in the contact region and extending in a second direction perpendicular to the first direction.

3. The semiconductor device according to claim 2, wherein the device satisfies the following relation:

$$S1<D$$

where D is defined as a diameter of the contacting portion as measured along a straight line passing through the contacting portion of the via hole in the contact region and extending in the second direction.

4. The semiconductor device according to claim 3, wherein the device satisfies the following relation:

$$S1<S2<D.$$

5. The semiconductor device according to claim 2, wherein the device satisfies the following relation:

$$S1<80 \text{ nm and } S2>80 \text{ nm}.$$

6. The semiconductor device according to claim 1, wherein the interconnection line is formed from tungsten or aluminum, and the via hole is formed from tungsten or aluminum, and the interlayer insulation film is formed from USG film, FSG film or TEOS film.

7. The semiconductor device according to claim 2, wherein the interconnection line is formed from tungsten or aluminum, and the via hole is formed from tungsten or aluminum, and the interlayer insulation film is formed from USG film, FSG film or TEOS film.

* * * * *